United States Patent
Nyström et al.

(12) 
(10) Patent No.: US 6,711,717 B2
(45) Date of Patent: Mar. 23, 2004

(54) METHOD AND SYSTEM FOR COMPILING CIRCUIT DESIGNS

(75) Inventors: Mika Nyström, Pasadena, CA (US); Alain J. Martin, Pasadena, CA (US)

(73) Assignee: California Institute of Technology, Pasadena, CA (US)

(*) Notice: Subject to any disclaimer, the term of this patent is extended or adjusted under 35 U.S.C. 154(b) by 0 days.

(21) Appl. No.: 10/269,386

(22) Filed: Oct. 11, 2002

(65) Prior Publication Data

US 2003/0172360 A1 Sep. 11, 2003

Related U.S. Application Data

(60) Provisional application No. 60/328,647, filed on Oct. 11, 2001.

(51) Int. Cl.[7] .............................................. G06F 17/50
(52) U.S. Cl. ................... 716/1; 716/11; 716/2; 716/5; 716/10; 716/18; 717/132; 717/139; 717/155; 703/14; 703/28
(58) Field of Search ................ 716/1, 2, 5, 10, 716/18; 326/93; 703/28; 707/1; 709/315, 238; 712/201, 211, 25; 714/814; 717/155, 139, 132

(56) References Cited

U.S. PATENT DOCUMENTS 5,859,981 A * 1/1999 Levin et al. ................ 709/238
5,884,066 A * 3/1999 Kuijsten ....................... 703/28
6,367,065 B1 * 4/2002 Leight et al. ................ 716/18
2001/0034594 A1 * 10/2001 Kohno et al. ................ 703/14

OTHER PUBLICATIONS

Jack Dennis, Data Flow Supercomputers. Computer, Nov. 1980, pp. 48–56. IEEE Computer Society, 1980.

* cited by examiner

Primary Examiner—Vuthe Siek
Assistant Examiner—Helen Rossoshek
(74) Attorney, Agent, or Firm—J. D. Harriman, II, Esq.; Coudert Brothers LLP

(57) ABSTRACT

The present invention is a programming language method called Pipeline Language 1 (PL1) and its associated compiler system for generating logical circuit designs. The semantics allow the implementation to add more slack than exists in the specification, aiding the design of slack-elastic systems. In PL1, the value probe and peek are the most basic operations: receiving a value is done by first using the peek, and then acknowledging it as a separate action. Another embodiment is a PL1 compiler comprised of a technology-independent front-end module and a technology-dependent back-end module. It parses the input, converts it into BDD expressions, checks determinism conditions, generates BDD expressions for assignments and sends and converts the BDD expressions to unary representation. The back-end compiler module is technology-dependent, meaning that different back-end modules generate different circuit design types (e.g. QDI and STAPL). All back-end module embodiments perform logic simplification on input programs.

21 Claims, 7 Drawing Sheets

METHOD AND SYSTEM FOR COMPILING CIRCUIT DESIGNS

The applicant claims priority to U.S. Provisional Patent Application titled "Asynchronous Pulse Logic", No. 60/328, 647, filed on Oct. 11, 2001, and is hereby fully incorporated by reference.

The invention was made by an agency of the United States Government or under a contract with an agency of the United States Government. The name of the U.S. Government agency is DARPA and the Government contract numbers DAAH 04-94-G-0274 and F29601-00K-0184.

BACKGROUND OF THE INVENTION

Portions of the disclosure of this patent document contain material that is subject to copyright protection. The copyright owner has no objection to the facsimile reproduction by anyone of the patent document or the patent disclosure as it appears in the Patent and Trademark Office file or records, but otherwise reserves all copyright rights whatsoever.

1. Field of the Invention

The present invention relates to circuit design, and in particular the invention is directed to a programming language method and an associated compiler system for generating logical circuit design.

2. Background Art

In software systems, we usually compile a program as follows. First, we convert the high-level program into an intermediate-language representation; this is mainly a syntactic transformation for streamlining the syntax of the program to simplify automatic translation tools' analysis of the statements of the program. Secondly, we convert the intermediate-level representation into a dataflow graph, which is an abstract representation of how each value computed by the program depends on previous operations and of how later operations depend on the value. Thirdly, we manipulate the dataflow graph, aiming at lowering the cost of evaluating the statements it implies, but maintaining its meaning. Lastly, we convert the optimized dataflow graph into a machine language program, which can be loaded and executed by a processor when desired.

The technique that has been evolved for compiling software programs into machine language is attractive because it cleanly separates the question of what is computed from how it is computed. Specifically, given a simple program that performs actions that are independent, the dataflow graph can be used to deduce this property. Having determined that the actions are independent, the compiler can convert them separately into the target language. The dataflow graph also represents the constraints on the reordering of actions in the program.

The dataflow technique can be applied to the compiling of HSE (Handshaking Expansion) into PRS (Production-Rule Set). However, because the necessary properties (stability and noninterference) are global system properties, this is not simple. The only known algorithms that work on general HSE programs conduct exhaustive state-space exploration. As far as is known, these algorithms all take exponential time in the worst case, and they do not in practice work on large systems.

The difficulties of directly compiling from a higher-level description to PRS suggest that this is the wrong way of going about things. A description of an algorithm at the level of the sequence of actions on each bit (or electrical node) of a system is simply at too fine a level for most purposes. Once an algorithm has been described in this much detail, it has been over-sequenced; and removing the extra sequencing is too difficult. The bad level of specification that we speak of is exactly the HSE level.

That the compilation from HSE to PRS is hard is not the only problem with this approach. Another is that we have no trustworthy metrics for determining when one compilation is better than another. While we could possibly develop such metrics for determining when a given compilation result will run faster than another in a known environment, we may not know a priori all the parameters of the environment where a circuit will operate; if we had to know these parameters before compiling the circuit, we should certainly not be able to claim that the compilation procedure is modular. And modularity is the principle, above all others, that we strive for in asynchronous design. Better then to abandon the HSE level in our day-to-day design work and use PRS templates for compiling directly from CHP to PRS; the resulting PRS could be trusted to work efficiently in most environments.

As an aside, it is important to note the description of the problem above is not a condemnation of the HSE language itself. The HSE notation is, as we have seen, extremely useful for designing the templates used for compiling from CHP to PRS. The HSE language is indeed the most convenient of the languages we use for describing handshaking behaviors (as it should be). What we are suggesting is however that we should probably not manipulate the HSE descriptions of processes too frequently; we should do it only when we are developing the compilation templates or when we have to design some special circuit that we do not know how to design well using the day-to-day templates.

SUMMARY OF THE INVENTION

The present invention is a programming language method and its associated compiler system for generating logical circuit designs.

One embodiment of the present invention is a programming language method called Pipeline Language 1 (PL1). The PL1 language is a simple language for describing the small processes that are the targets of hardware systems that we desire to build. The semantics of the PL1 language allow the implementation to add more slack than exists in the specification; hence the language is appropriate for the design of slack-elastic systems.

In most message-passing programming languages (CHP in particular), using a data value that arrives on a channel first requires receiving it. In the hardware implementation, however, we can use and receive the value at the same time, or even delay the acknowledging of the value so that it remains pending. This functionality we have added to CHP with the value probe and peek operations. In the PL1 language the value probe and peek are the most basic operations: receiving a value is done by first using it (the peek), and then acknowledging it as a separate action.

PL1 programs consist of sets of guarded commands. The guards are not necessarily mutually exclusive. The semantics are that the process waits until it can determine, for each guard, whether or not it will be true for the next set of values that shall arrive. Thus we can evaluate expressions while banishing from our language the "undefined" value of a channel: there is in PL1 no way of writing the true negated probe.

PL1 automates the design procedure from CHP-level specification to STAPL (Single Track Asynchronous Pulse Logic) circuit. A more detailed description of STAPL is in co-pending U.S. Patent Application titled "Method and Apparatus for an Asynchronous Pulse Logic Circuit" filed Oct. 11, 2002, Ser. No. 10/xxx,xxx, and is hereby incorporated by reference. This automation helps STAPL circuit designers avoid both needless labor and careless mistakes.

The designer usually designs circuits at a high level of abstraction, i.e., in terms of digital abstractions. For this, the abstract CHP-level of description is ideal. Next, the design is compiled from the CHP to transistor networks, and thence finally to concrete geometric lay-out. The automation offered by PL1 reduces the amount of work done by human designers, especially at the level when intricate but mindless tasks like logic minimization are needed.

The reason the PL1 language is preferable to CHP follows from the PL1 language's being capable of expressing only a small fraction of what the CHP language can express. It is a fraction whose compilation into efficient APL and QDI circuits is well known. However, the PL1 language is not intended to replace the CHP language; on the contrary, it is expected that software tools will be written that shall be able to automatically convert CHP into PL1, or better yet, into PL1-equivalent data structures.

Another embodiment of the present invention is a compiler system that enforces the language of PL1 and creates valid compilation of programs written in the PL1 language. The compiler has two main components—a front-end module and a back-end module. The front-end module is technology-independent. It parses the input program, converts the input into BDD expressions, checks the determinism conditions of the input program, generates BDD expressions for assignments and sends and finally converts the BDD expressions to unary representation so they can be received by the back-end module. The back-end compiler module is technology-dependent. There are several embodiments of back-end modules in the present invention to generate circuit designs for different types of circuit designs (e.g. QDI and STAPL). However, all back-end modules, regardless of types, perform logic simplification on input programs. Finally, in the code generation stage, the STAPL back-end compiler module uses a heuristic to check whether a value on an input channel is acknowledged by the outputs.

BRIEF DESCRIPTION OF THE DRAWINGS

These and other features, aspects and advantages of the present invention will become better understood with regard to the following description, appended claims and accompanying drawings where:

DETAILED DESCRIPTION OF THE INVENTION

Figure 1:
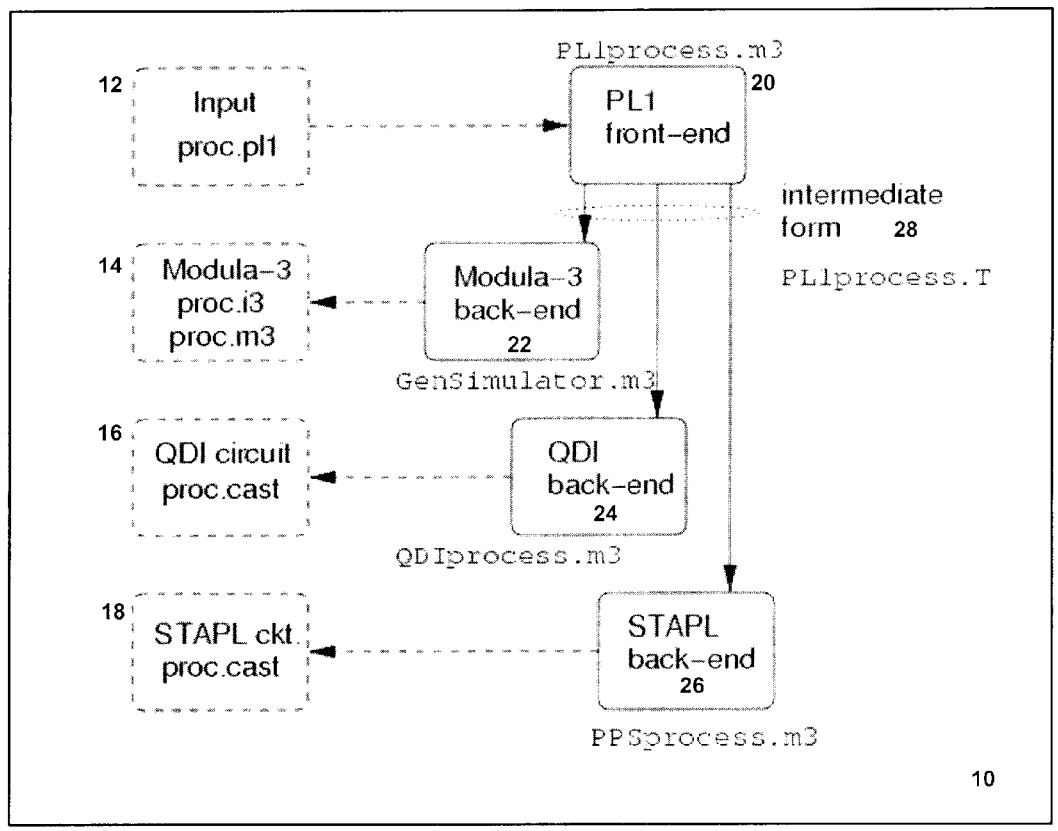
FIG. 1 is a block diagram representation that shows the structure of the PL1 compiler.

The present invention is a programming language called Pipeline Language 1 (PL1) and its associated compiler for generating logical circuit designs. In the following description, numerous specific details are set forth to provide a more thorough description of embodiments of the invention. It is apparent, however, to one skilled in the art, that the invention may be practiced without these specific details. In other instances, well known features have not been described in detail so as not to obscure the invention.

In the following description, three main sections are presented to describe the different aspects and embodiments of the present invention. The first section describes the Pipeline Language 1 (PL1) and its properties. The second section describes the compiler embodiment associated with PL1. The final section gives an detailed description of the syntax and semantics of PL1.

1 Pipeline Language 1

Compiling arbitrary CHP (Concurrent Hardware Processes) programs directly (i.e., syntactically) into circuits is possible but doing it efficiently is difficult. This is why, in this embodiment of the present invention, we have chosen to compile only a restricted subset of CHP programs into circuits. The circuits should be capable of the following:

Computing an arbitrary logical function

Computing results conditionally

Receiving operands conditionally

Storing state

It must be noted that there is nothing in these capabilities that is specifically tied to STAPL implementations, or even anything that is necessarily tied to hardware implementations. STAPL circuits are described in co-pending U.S. Application titled "Method and Apparatus for an Asynchronous Pulse Logic Circuit" (referenced in the Summary section).

We could from these abstractions equally well build up a software-programming methodology. What is however clear is that these capabilities are fundamentally "asynchronous"; it is possible to introduce a clock to sequence the actions further.

The STAPL circuits developed in the referenced application have the desired capabilities, but they have no further means of control. Hence, the only programs that they can implement have the structure of the templates such as the one listed below, $$*[<, i::L_i?x_i>; <j::R_j!f_j(x)>],$$
$$*[<, i::L_i?x_i>; <j::[G_j(x) \rightarrow R_j!f_j(x) \Box \neg G_j(x) \rightarrow \text{skip}]>],$$
$$*[<, i::L_i?y_i>, <k::x_k:=x'_k>; <j::R_j!f_j(y,x)>,$$
$$<k::x'_k:=g_k(y,x)>],$$

as well as the conditional-inputs template that we have not made explicit, and combinations of any of these templates.

The conditional-inputs template is not easy to describe in terms of CHP; let us merely say here that any of the inputs can be conditional. A more accurate definition of what we can and cannot do is given in Section 3, where the syntax and semantics of PL1 is further described.

A CHP program fitting the templates described above is easy for us to compile because it uses only a small, carefully chosen part of the CHP language. For the purposes of making clear the compilation procedure and simplifying the compiler as well as carefully delineating the kinds of conditional programs we can compile, we shall describe the programs in terms of a language that compactly captures exactly those behaviors that we know how to compile; this language we call Pipeline Language, version 1: abbreviate as PL1.

Figure 5:
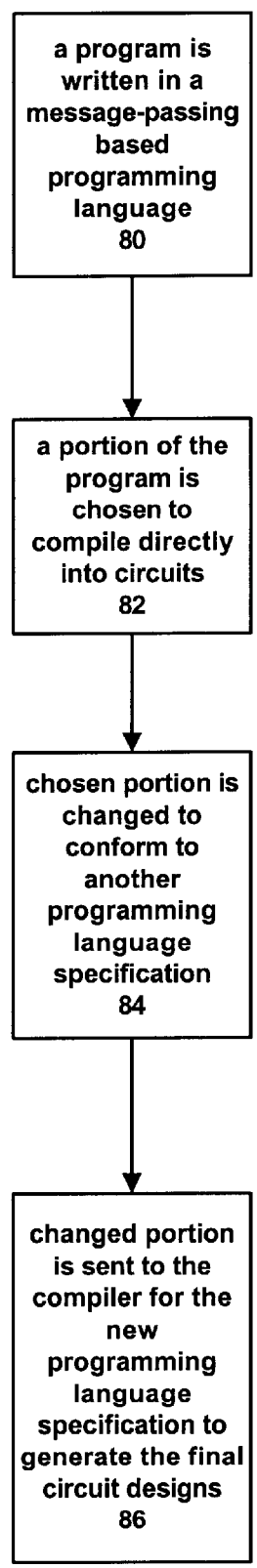
FIG. 5 depicts a method of programming circuit design.

FIG. 5 shows the overall usage of Pipeline Language, version 1. In step 80, a program is written in a message-passing based programming language such as CHP. Then a portion of the program is chosen to compile directly into circuits in step 82. In step 84, the chosen portion is changed to conform to another programming language specification such as PL1. Finally, in step 86, that the changed portion is sent to the compiler for the new programming language specification to generate the final circuit designs.

1.1 Channels or Shared Variables?

One of the novel aspects of the PL1 language is that channels are read and written as if they were shared variables. However, the implementation, not the programmer, ensures that all channel actions are properly sequenced. The language forbids interfering constructs.

This feature provides a solution to the following problem. Although CHP processes communicate with each other on channels, once the processes are implemented as circuits, the channels are implemented as shared variables. The shared variables' being products of such a compilation implies certain properties about them: for instance, a (slack-zero) channel is never "written" (i.e., sent on) twice without an intervening read. These properties may be useful for further compilation or for verification, but a naïve outside observer would not be able to tell that the shared variables resulted from a channel compilation. A single semantic construct hence can be described as either a channel, at the CHP level; or as a shared variable, at the circuit level. It is almost certain that some useful operations are difficult to do with only the CHP constructs; it is even more certain that shared-variable hardware design is far more difficult, far less modular, and far more time-consuming than CHP hardware design.

The PL1 language aims at combining the channel and shared-variable constructs in a way that, for the present circuit-design purposes, improves upon both the CHP and shared-variable (HSE or PRS) descriptions. Thus, in the PL1 language, we read and write channels as if they were shared variables. However the compiler implementation—not the programmer—ensures that all channel actions are properly sequenced. Interfering constructs are thus forbidden.

The PL1 language also only allows "safe" constructs. Writing many simple CHP processes in terms that are close to desired implementations involves the frequent use of constructs like the value probe or the peek operation. While the responsible use of these constructs is unobjectionable, the untrained eye cannot easily determine if the use has been responsible or not. Irresponsible uses quickly lead to non-deterministic programs, non-slack-elastic programs, and other abominations.

1.2 More Properties of the PL1 Language

The PL1 language is a simple language for describing the small processes that we should like to build hardware systems out of. The semantics of the PL1 language allow the implementation to add more slack than exists in the specification. Hence the language is appropriate for the design of slack-elastic systems.

In most message-passing programming languages (CHP in particular), using a data value that arrives on a channel first requires receiving it. In the hardware implementation, however, we can use and receive the value at the same time, or even delay the acknowledging of the value so that it remains pending. This functionality we have added to CHP with the value probe and peek operations. In the PL1 language the value probe and peek are the most basic operations: receiving a value is done by first using it (the peek), and then acknowledging it as a separate action.

PL1 programs consist of sets of guarded commands. The guards are not necessarily mutually exclusive. The semantics are that the process waits until it can determine, for each guard, whether or not it will be true for the next set of values that shall arrive. For instance, determining whether the guard a==1 is true requires knowing the value of a. It is not enough that no value of a be present, since this would not be slack-elastic: the value 1 could have been delayed en route; hence if there is no value of a yet present and a==1 is evaluated, the process will suspend. Of course, a value of 0 does establish that a will not next be 1. Thus we can evaluate expressions while banishing from our language the "undefined" value of a channel: there is in PL1 no way of writing the true negated probe.

An example PL1 program is given below for illustration:

```
define filter (e1of2 c, l, r)
{
    communicate {
        c==1 -> r!l;
        true -> l?,c?;
    }
}
```

The expression syntax is the same as in the C language. The first line is the prototype for the process. The declaration of the parameters as e1of2 means that these are channels that can hold the values 0 and 1. Hence, evaluating c==1 requires receiving a value on c.

If c==1 evaluates to false (i.e., if c should get the value 0), then only the second guarded command is executed, and the values on l and c are received and acknowledged; the process suspends until values are present on both the channels.

If c==1 evaluates to true (i.e., if c should get the value 1), then both the guarded commands will execute; the value received on l will be sent on r as well.

The PL1 language is defined so that programs like this one are meaningful, even though l and c are each used in two places at the same time. In essence, all the uses that require the value are performed first, then it is acknowledged. Only strictly contradictory programs are disallowed (see below). Section 3 has more details.

1.2.1 An Example: The Replicator

It is often useful to be able to replicate data sequentially; let us therefore consider the process $$REP1 \equiv *[L?x; c:=true; *[c \rightarrow R!x; C?c]].$$

If we are to implement REP in STAPL, we shall have to remove the nested loop from this program and rewrite it using value probes. The result of this is $$REP2 \equiv$$
$$*[[ \overline{C=true} \rightarrow R!(L?), C?$$
$$\quad \Box \overline{C=false} \rightarrow R!(L?), C?$$
$$]].$$

The REP2 program is not, strictly speaking (given the usual semantics of CHP), equivalent to REP1; but it is equivalent under the assumptions of slack-elasticity. The transformation from REP1 to REP2 is anything but obvious; it is difficult to explain what it is that makes REP2 a reasonable program for an implementor to compile into a circuit and what it is that makes REP1 unreasonable.

In the PL1 language, we must declare the variables; this is no drawback, since declarations would anyhow be necessary for specifying the variable types at some point before compilation into the target PRS/circuit; we thus arrive at, e.g.,

```
define rep3(e1of2 c,l,r)
{
    communicate {
        true -> c?,r!l;
        c==0 -> l?;
    }
}.
```

(We should note that the semicolons at the end of each line are syntactic, separating the two possibly concurrent statements true →c?,r!l and c==0→l?: in this regard, these semicolons have the same rôle as the commas in the interface declaration e1of2 c,l,r; on the other hand, the comma in c?,r!l is semantically meaningful, signifying parallel execution. There should be no confusion since there is no way of specifying sequential execution in the PL1 language beyond the global sequencing that is implied by the process structure itself.)

There are two executable statements in this PL1 program:

true→c?,r!l;

c==0→l?;

We call the construct c==0→l? a guarded command (the guarded-command idea is due to Dijkstra), where c==0 is called the guard, and l? the command or action; l we occasionally shall refer to as an action variable.

It is worthwhile stating here that the semantics of PL1 are such that a process's concurrently executing r!l and l? presents no trouble: the actions are sequenced by the implementation so that they shall be non-interfering. Likewise, the implementation will see to it that the action c? is delayed enough that the condition c==0 may be safely evaluated.

The reason the PL1 language is preferable to CHP follows from the PL1 language's being capable of expressing only a small fraction of what the CHP language can express. It is a fraction that we know how to compile into efficient APL and QDI circuits. To some extent, we use the PL1 language so that the compiler may avoid the difficult problem of determining that REP2 is a reasonable implementation of REP1 or that rep3 is a reasonable implementation of either; we should also like to avoid stating exactly what subset of CHP shall be a legal input to our circuit compilation method.

The PL1 language is not intended to replace the CHP language; on the contrary, it is expected that software tools will be written that shall be able to automatically convert CHP into PL1, or better yet, into PL1-equivalent data structures.

2 Compiling PL1

Compiling PL1 programs, regardless of the target language, is a task best carried out in phases. The first phase, parsing and analysis of the input program, is common to each target language; the second, generating the output, varies with the target language. FIG. 1 shows the resulting structure of compiler PL1 10. In summary, the two-phase compilation is handled by front-end compiler module (first phase) and several back-end compiler modules (second phase).

In the figure, files are shown in dashed boxes; program modules in solid. First, PL1 compiler front-end 20 takes input file 12 (as shown, the example file is named "proc.pl1"). Here we have shown the three back-end modules for generating different kinds of target representations. Module 22 generates Modula-3 code that shall compile and link as part of a Modula-3 simulation system. The output is a Module-3 file 14 (in this example, "proc.i3" and "proc.m3"). Another back-end module is QDI back-end module 24 that generates QDI circuit descriptions file 16 ("proc.cast"). Finally, there is STAPL back-end module 26 that generates STAPL circuit descriptions file 18 ("proc.cast"). The last QDI and STAPL modules generate CAST (Caltech Asynchronous Synthesis Tools, a hardware description language) files 16 and 18 that describe a single process and that shall have to be combined with some infrastructure ("header files") to be useful.

In between PL1 front-end compiler 20 and the three back-end modules is an intermediate form of the compiler (28). This intermediate form is a Modula-3 data structure, not a file. This data structure is an object, called a PL1process.T(28). The back-end modules are implemented similarly: each back-end module specifies an object type that inherits many of its properties from a generic "process object-type," ProcessSpec. T,which incidentally is also the supertype of the PL1process.T.

2.1 PL1-compiler Front-end

The PL1 compiler represents the program being compiled as a Modula-3 object; all guards and actions of the program are represented in terms of binary decision diagrams (BDDs).

Figure 2:
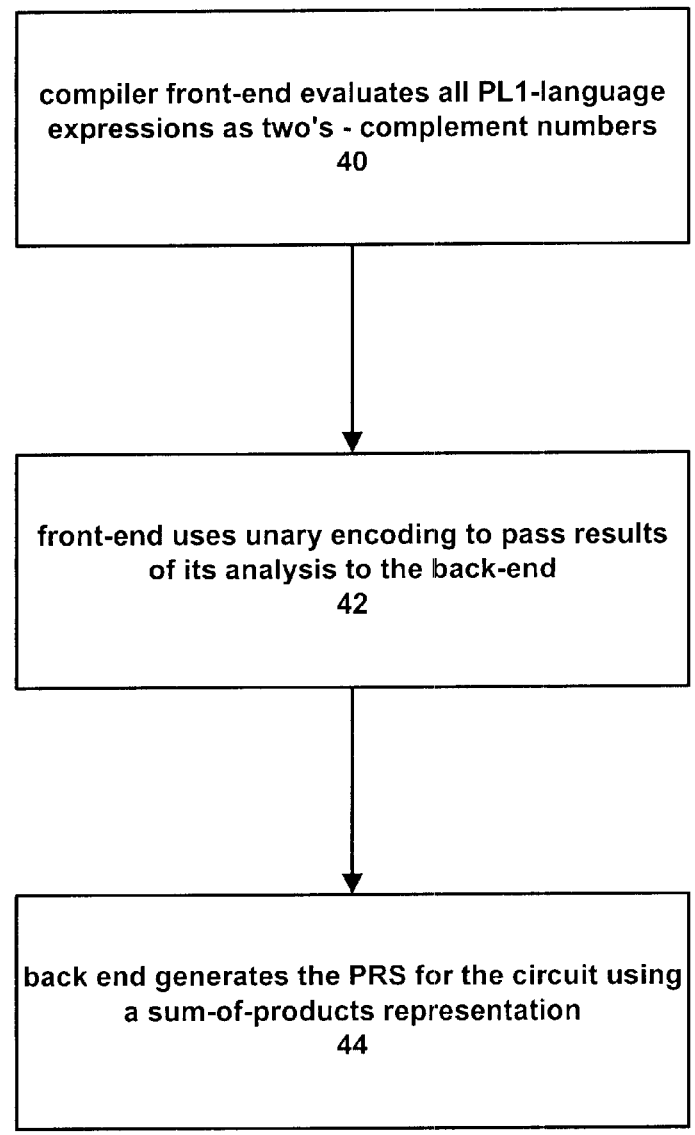
FIG. 2 is a flow chart showing the operation of the compiler.

FIG. 2 shows the three levels of representation are used for data. First, in level 40, the compiler front-end evaluates all PL1-language expressions as two's-complement numbers (a BDD expression is used for each bit of the numbers, the unspecified bits being treated as false). Then, in level 42, when the front end passes the results of its analysis to the back end, it uses a unary encoding, which makes the results suitable for the back end's compiling into circuits that use delay-insensitive codes. Lastly, in level 44, the back end generates the PRS for the circuit using a sum-of-products representation.

Figure 3:
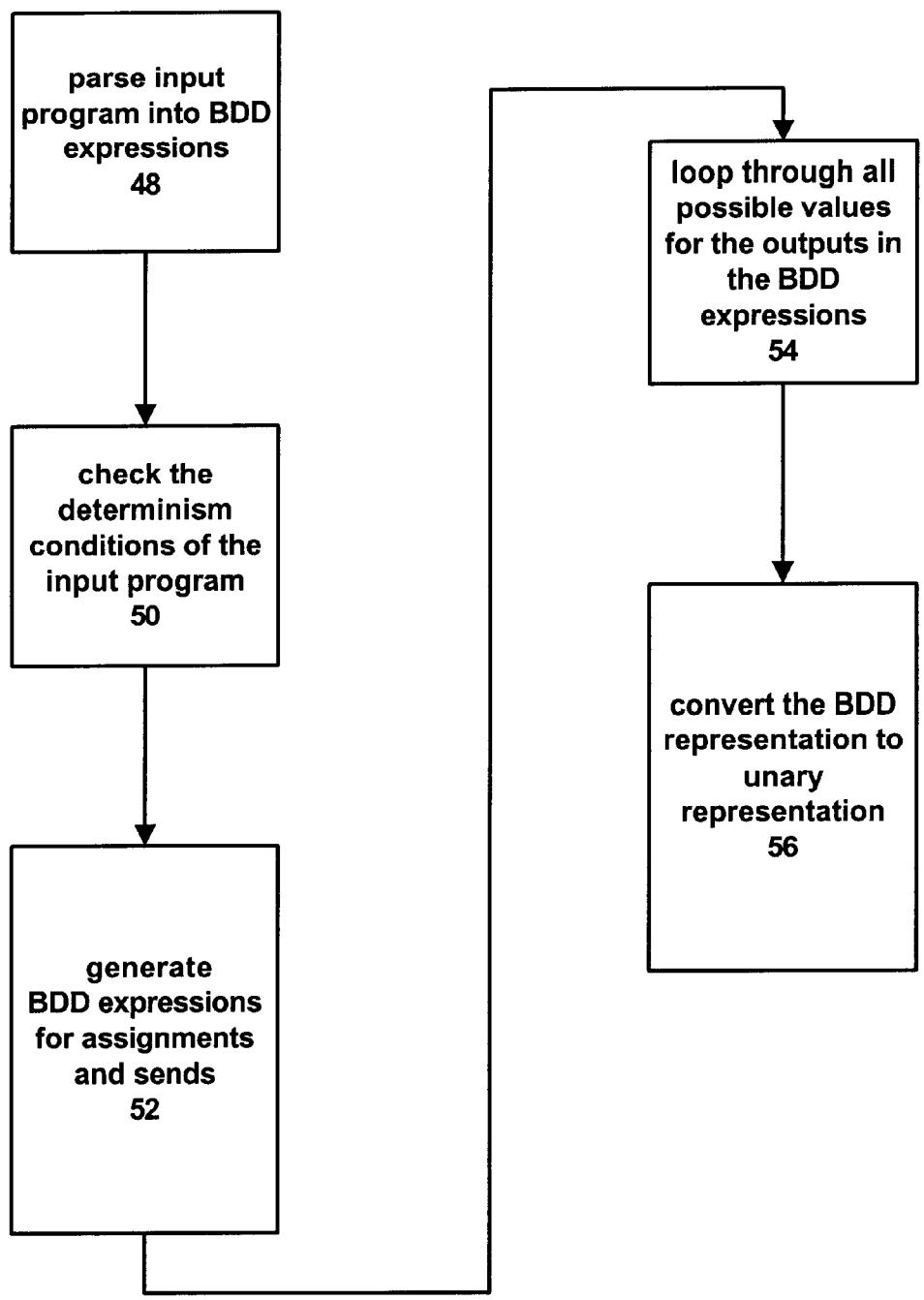
FIG. 3 is a flow chart showing the operation of the front-end compiler module.

In terms of the action steps that take place in the front-end compiler, FIG. 3 shows the primary steps that the front-end compiler needs to perform. The first step, step 48, is to parse the input program into BDD expressions. This is followed by step 50, when the compiler checks the determinism conditions of the input program. Then in step 52, the compiler generates expressions for assignements and sends. These BDD expressions are now listed by data channels, instead of the original program construct. These expressions can be more simple than the original generated BDD expressions. Then in step 54, the compiler loops through all possible values for the outputs in the BDD expressions. In step 56, the compiler converts the BDD representation to unary representation.

2.1.1 Determinism Conditions

After parsing the input program and generating the appropriate BDD representations for the expressions used in it, the first task of the compiler front-end is the checking of some remaining determinism conditions (step 50 of FIG. 3): while the slack-elastic design-style handles determinism issues well, the syntax of PL1 allows the programmer to specify meaningless, nondeterministic programs, e.g.,

```
define mistake(e1of2 r)
{
    communicate {
        true -> r!0;
```

-continued

```
        true -> r!1;
    }
}
```

We cannot tell if the programmer intended that mistake should send a 0 or a 1 repeatedly on r; or perhaps he intended some interleaving? The two benefits of ruling out mistakes like this one are: first, that programming mistakes are caught and programs will have well-defined meanings; and secondly, that the back-end of the compiler can now use the expressions of the PL1 program directly in generating its target PRS: the logical expressions of the PL1 program can be converted into production rules without further ado.

It is not easy to banish programs like the example mistake. The first-glance solution is to require that actions on a particular interface variable or state variable appear syntactically in a single place in the program for each such variable. This is unsatisfactory because it is often desirable to use a particular variable in two completely different ways, the choice being based on some arbitrary piece of information: consider a process that could either add or multiply its two data inputs based on a control signal; writing c==0→r!(a+b); c==1→r!(a*b); is easy, but if we had to combine the + and * operators in a single boolean expression?—at best, a confusing program; much more likely, an incorrect one.

At second glance, we could simply forbid that the actions on interface variables or state variables "appear dynamically" in several places on the same execution cycle of a program. With this view,

```
define buffer(e1of2 c,r)
{
    communicate {
        true -> c?;
        c==1 -> r!1;
        c==0 -> r!0;
    }
}
``` would be right, but mistake would be wrong. But what should we make of

```
define dubious_buffer(e1of2 c,r)
{
    communicate {
        true -> c?;
        c==1 -> r!1;
        true -> r!c;
    }
} ?
```

He who would take the position that dubious_buffer is another mistake would not injure reason, but the PL1 language described in Section 3 allows dubious_buffer as having the same meaning as buffer. The grounds for allowing it are a very simple execution model for PL1 programs: on a given execution of a PL1 program, all enabled actions are collected and then executed concurrently, at most one action to an interface variable or state variable; on the next execution of the program, no memory of these events is retained except as specified in explicit state variables. We hence must forbid x!0, x!1; but of the two interpretations of x!0, x!0, viz. forbidden and idempotent, we choose the latter (i.e. x!0).

To check the determinism conditions, the compiler must make certain that whenever two commands are enabled at the same time, any overlapping state variables or send channels are treated the same way. In practice, we can also consider any invariant I that the programmer should care to mention; to check the conditions for the PL1 program $G_0 \to S_0(C_{S0}) \square\ G_1 \to S_1(C_{S1}) \ldots$, the compiler hence has to run the following:

```
forall P = G_i ∧ G_j ∧ I
    if P ≠ false then
        forall a ∈ vars(C_Si) ∩ vars(C_Sj)
            assert val(b_a,C_Si | P)=val(b_a,C_Sj | P)
        end
    end
end
```

What this program does is the following: for each pair of guards $G_i$ and $G_j$, we check for a non-zero overlap of the pair of guards given the invariant I. If a pair of guards does overlap (i.e., if it is conceivable that they should both be enabled at the same time), we must check the equivalence of expressions sent on the same channels; the channels that are mentioned for both the guarded commands are given by the expression $vars(C_{si}) \cap vars(C_{sj})$. The last step is checking that the values that are sent do match; we check this conditionally on every bit of the two's-complement vector of BDDs, given the overlap condition P—this is denoted by assert $val(b_a,C_{si}|P)=val(b_a,C_{sj}|P)$.

He that yet insists that we should forbid x!0, x!0 cannot cite the complexity of determinism-checking in his favor: it would be quite as difficult to figure out, as we anyway must, which guards overlap as it is to carry out the described determinism checks; the programmer's extra freedom coming at so little cost, we should be miserly to deny him it.

2.1.2 Data Encoding

Once the compiler front-end has checked the determinism conditions, it generates the expressions for assignments and sends in terms of two's-complement BDD expressions (step 52 of FIG. 3). Expressions that can take on more than two values, e.g., for those variables declared 1of4, 1of8, etc., are thus represented by a vector of BDDs. (One embodiment of the present invention has a restriction that variables must be of the form 1 of n, where n is a power of two. The e in e1 of 2 is present for historical reasons only; being logical, we should write 1of2 in the declaration and leave the e to be filled in by the QDI-compiler back-end.) The expressions are first generated in terms of sets of guard-value pairs (G, E) for sends and assignments and simply guards G for receives; the list entries are collectively called actions.

Let us use as an example the two-way, 1-of-4 merge:

```
define merge2_4(e1of2 c; e1of4 la, lb , s)
{
    communicate {
        c==0 -> s!la,la?,c?;
        c==1 -> s!lb,lb?,c?;
    }
}
```

The BDD representation will be: for c, $b_c$; for la, the vector $[b_{la,0}, b_{la,1}]$; for lb, the vector $[b_{lb,0}, b_{lb,1}]$; and for s, the vector $[b_{s,0}, b_{s,1}]$. The guard-value set for s is $\{(b_c, [b_{lb,0}, b_{lb,1}]), (\neg b_c, [b_{la,1}, b_{la,0}])\}$.

The compiler's first step towards generating the logic unary expressions for sends and assignments from the BDD representations is to loop through all the possible values v for the outputs (step 54 of FIG. 3). If we consider an action variable x, then we may state the condition c that v is sent on or assigned to x by a single action (G, E) thus: $c=(E=v) \land G$. Since we have ensured that actions are non-interfering, we can aggregate the conditions for v on x for each of the actions in the action set for x, $A_x$; we now introduce $x_v$ as being the (unqualified) condition upon which the value v is sent on or assigned to x:

$$x_v = \bigvee_{i \in A_x} (E_i = v) \land G_i \qquad (1)$$

In terms of our example, we may illustrate by considering $s_2$: $v=2$ is equivalent to [false, true]. Considering the first element of the guard-value set, we may compute $c=(E=v) \land G: \neg b_{lb,0} \land b_{lb,1} \land b_c$; considering the second, we compute $\neg b_{la,0} \land b_{la,1} \land \neg b_c$.
Hence $$s_2 = \neg b_{lb,0} \land b_{lb,1} \lor b_c \lor \neg b_{la,0} \land b_{la,1} \land \neg b_c. \qquad (2)$$

The next issue that we need to handle is that the expression that we have computed for determining whether we shall send a value $x_v$ is in terms of a BDD on the two's-complement representation of PL1 variables, whereas $x_v$ itself is already suitable for a unary encoding. Hence we shall have to convert the representation of the BDD for $x_v$ to a unary representation (step 56 of FIG. 3). Substituting unary expressions for the two's-complement expressions is the most straightforward way of doing this. We introduce the unary "rails expression" $r_{x,i}$ (step 56 of FIG. 3) as the BDD describing the condition when action variable x takes on value i; we now have that we should in our example replace $b_c \land r_{c,1}$ and $b_{la,0} \land r_{la,1} \lor r_{la,3}$. We also have the useful invariants, due to the 1-of-n encodings, that $$\forall x::\forall i::\forall j: j \neq i: r_{x,i} \Rightarrow \neg r_{x,j}. \qquad (3)$$

Returning to our example, we see that we may write $s_2$ in terms of the r's as $$s_2 = \neg (r_{lb,1} \lor r_{lb,3}) \land (r_{lb,2} \lor r_{lb,3}) \land r_{c,1} \lor \neg (r_{la,1} \lor r_{la,3}) \land (r_{la,2} \lor r_{la,3})$$
$$\land \neg r_{c,1}. \qquad (4)$$

It is immediately obvious that some simplifications can be made; e.g., we observe that $r_{lb,3}$ is unnecessary in $\neg (r_{lb,1} \lor r_{lb,3}) \land (r_{lb,2} \lor r_{lb,3}) \land r_{c,1}$ since it appears in the form $\neg x \land \neg r_{lb,3} \land (r_{lb,2} \lor r_{lb,3})$, and $r_{lb,2} \Rightarrow \neg r_{lb,3}$. Following this hint, we simplify using Equation 3 and get that $$s_2 = r_{lb,2} \land r_{c,1} \lor r_{la,2} \land \neg r_{c,1}. \qquad (5)$$

This is almost what we should like to see, but $\neg r_{c,1}$ is cause for concern. Recall that our final objective is the generating of domino logic. (While this discussion is phrased in terms of circuits, note that it applies equally well to software implementations that use shared variables: the naive implementation of $\neg r_{c,1}$ that we avoid in the hardware would in the software involve the testing of a channel's being empty, i.e., a negated probe. Either naïve implementation destroys slack-elasticity, whence they must be avoided and the semantic interpretation that we take in the text must be substituted.) The evaluation part of domino logic consists of n-transistors only, and with the data encodings that we use, we cannot directly test a negative expression like $\neg r_{c,1}$. What we should realize is that $\neg r_{c,1}$ is not to be understood as testing that "the voltage on the circuit node c.1 is close to GND"—after all, we have not brought up anything at all about circuits in our discussion of PL1, so why should we think this?—instead, it is to be understood as meaning "the value of c.1 will not become close to Vdd on this execution cycle": the very same statement that can in a slack-elastic system only be tested by "the value of c.0 has become close to Vdd," i.e., we must replace $\neg r_{c,1} \land r_{c,0}$ and we should similarly treat any other negated literals that remain after simplification. Once we have done this, we may directly identify the $r_{x,i}$ BDD literals with the actual circuit nodes x.i.

2.2 PL1-compiler Back-end

The PL1-compiler back-end is implementation-technology dependent. Therefore while what is described here is applicable to the embodiments of the present invention, it needs not to apply to all back-end compiler modules. Broadly speaking, the back-end modules that have been implemented fall into two categories: circuit generators and software generators.

The software generators are useful for fast high-level simulation that captures enough of the synchronization behavior of processes to ensure that the system being designed does compute the right thing and does not deadlock or exhibit other unwanted characteristics; simulation at this level is even useful for capturing reasonably accurate performance estimates. Simulation at this level is much faster than what is possible with PRS-level simulators (on the order of two to three orders of magnitude).

2.2.1 Slack

Because predicting the exact amount of slack that shall be present in a circuit implementation of a PL1 program can be difficult, we desire that the software-simulator implementation of the program should have an amount of slack that helps in finding bugs. Manohar has proved that adding slack to certain kinds of deterministic and non-deterministic systems (which he calls slack-elastic) cannot change the degree of nondeterminism or cause deadlock, whereas it is obvious that removing slack may cause deadlock; hence the software simulator should provide, as far as possible, at most as much slack as the hardware implementation. Things having been thus arranged, we should know that if the software implementation runs correctly, then the hardware implementation, which has at least as much slack everywhere, must also run correctly.

The reason that it is not entirely obvious how much slack a hardware is that, in embodiments of the present invention, we should prefer allowing the compiler back-end to adjust the amount of slack, if it can thereby improve the circuit implementation.

Let us consider two examples. First, the full-adder:

```
define fa(e1of2 a,b,c, s,d)
{
    communicate {
        true -> a?,b?,c?,s!(a+b+c)&0x1,d!!!((a+b+c)&0x2);
    }
}
```

If we compile fa into a circuit (either STAPL or QDI), we find that the obvious production rules for the carry-out d have the form ... $\land ((a.0 \land b.0 \land c.0) \lor (a.0 \land b.0 \land c.1) \lor (a.0 \land b.1 \land c.0)$
$\lor (a.1 \land b.0 \land c.0)) \rightarrow d\_.0$
... $\land ((a.1 \land b.1 \land c.1) \lor (a.1 \land b.1 \land c.0) \lor (a.1 \land b.0 \land c.1)$
$\lor (a.0 \land b.1 \land c.1)) \rightarrow d\_.1$, where . . . stands for technology-dependent control signals. Because a slack-elastic system's correctness depends only on the sequence of values sent on its channels and not on the timing of those values, and because we may assume that a correct system does not deadlock, we may infer that the expression $a.0 \wedge b.0 \wedge c.0 \vee a.0 \wedge b.0 \wedge c.1$ may be "simplified" to $a.0 \wedge b.0$. This is especially desirable for the full-adder, because cascading full-adders into an n-bit adder will lead to a design whose latency is limited by the length of the carry chain; if we do not make the "simplification," then n will always determine the input-to-output latency of the circuit, since the carry information must always propagate from the least significant bit to the most significant bit, regardless of the disposition of the data; if on the other hand we do "simplify," then what matters is only the length of the longest string of carry-propagates for the particular pair of n-bit numbers being added. There is really no reason for avoiding the replacement: the circuit will be simpler and faster, and it will have more slack, slack that may allow the system to run faster because there are fewer data dependencies.

Secondly, let us consider the two-way merge:

```
define merge(e1of2 c,la,lb,r)
{
    communicate {
        true -> c?;
        c==0 -> r!la,la?;
        c==1 -> r!lb,lb?;
    }
}
```

For this program, the obvious production rules would be as follows:

. . . $\wedge (c.0 \wedge la.0 \vee c.1 \wedge lb.0) \rightarrow r\_.0\downarrow$
. . . $\wedge (c.0 \wedge la.1 \vee c.1 \wedge lb.1) \rightarrow r\_.1\downarrow$ Can we make the same sort of "simplification" as we did for the full-adder? Yes and no. In logical terms, the "simplification" can be stated as a weakening of the production rules that respects the determinism conditions; any such weakening is permitted. In merge, we are permitted to weaken the above thus:

. . . $\wedge (c.0 \wedge la.0 \vee c.1 \wedge lb.0 \vee la.0 \wedge lb.0) \rightarrow r\_.0\downarrow$
. . . $\wedge (c.0 \wedge la.1 \vee c.1 \wedge lb.1 \vee la.1 \wedge lb.1) \rightarrow r\_.1\downarrow$ But how is this a "simplification"? We have added slack by logical weakening, as before, but the circuit has now become more complicated—it has more transistors than before the transformation. Except under special circumstances, we should probably avoid this kind of transformation. Some may propose that the extra transistors are a small price well worth paying. However, if we look at the case when the $la.0 \wedge lb.0$ disjunct is enabled (true), the input value on c is completely ignored, and we shall have to add completion circuitry. This price was not so small after all.

2.2.2 Logic Simplification

The previous section makes it clear that there are choices to be made at the circuit level. Given the BDD representation of $c.0 \wedge la.0 \vee c.1 \wedge lb.0$, which need indeed not look at all similar to the straightforward sum-of-products form $c.0 \wedge la.0 \vee c.1 \wedge lb.0$, the backend compiler must decide what production rule should generated. Another decision that can be made at this point involves whether the program should be weaken maximally, or not at all.

These decisions depend, of necessity, on things such as the implementation technology, and in general we should not be surprised to learn that the optimal answers vary from situation to situation, even within a single system implemented in a single technology. Instead of examining all the possible cases, the present invention has a heuristic procedure for going from the BDDs to production rules that are reasonably efficient. In particular, this procedure makes the "right" choices for both fa and merge of the previous section. The heuristic procedure gives a framework by which new back-end compiler modules can be created.

Figure 6:
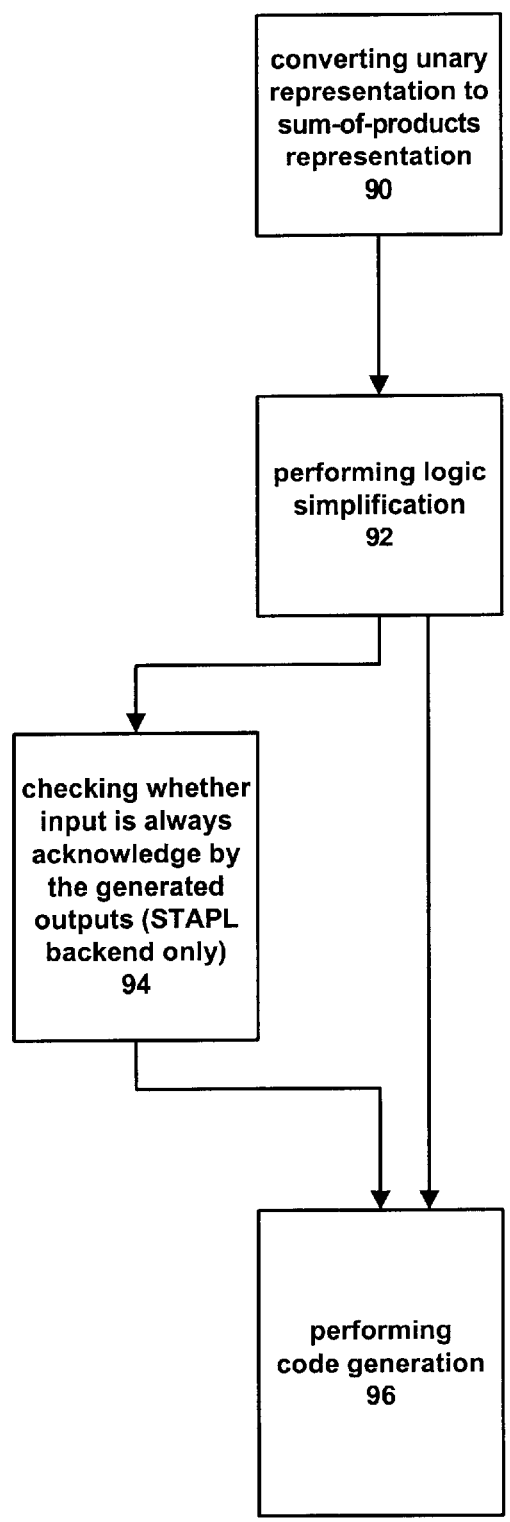
FIG. 6 is a flow chart showing the operation of the back-end compiler module.

The overall function of the compiler back-end is depicted in FIG. 6. First it receives the unary representation of the input program from the front-end and converts it to a sum-of-products representation (step 90). Then in step 92, the back-end performs logic simplifcation. If the back-end compiler module is written for STAPL circuits, it checks whether input is always acknowledge by the generated outputs in step 94. Finally code generation (step 96) is performed to give the final desired circuit design output.

Let us take as an example the merge logic described above to describe how back-end compiler embodiments of the present invention are configrued to run. The details of the structure of the BDD representing $c.0 \wedge la.0 \vee c.1 \wedge lb.0$ need not concern us overly here, because we are not going to make any more use of the special properties of the BDD data structure; the main thing for us to remember about it is that it looks nothing like what we want for our circuit implementation: in fact, it happens to have the form (the particulars depend on an arbitrary variable ordering, so this is only an example):

$$r_{c,0} \wedge (r_{la,0} \wedge \text{true} \vee (r_{c,1} \wedge (r_{lb,0} \wedge \text{true} \vee \text{false} \wedge \qquad (6)$$

$$\neg r_{lb,0}) \vee \text{false} \wedge \neg r_{c,1}) \wedge \neg r_{la,0}) \vee$$

$$(r_{c,1} \wedge r_{lb,0} \wedge (\text{true} \vee \text{false} \wedge \neg r_{lb,0}) \vee \text{false} \wedge \neg r_{c,1}) \wedge \neg r_{c,0}$$

Following the procedure for negated literals we mentioned above, we should arrive at—now represented as a sum-of-products expression (step 90 of FIG. 6)

$$c.0 \wedge la.0 \vee c.1 \wedge lb.0 \wedge c.1, \qquad (7)$$

where the extra c.1 is obviously superfluous.

How do we know that the c.1 is superfluous? Quite simply because $$c.0 \wedge la.0 \vee c.1 \wedge lb.0 \wedge c.1 \equiv c.0 \wedge la.0 \vee c.1 \wedge lb.0 \qquad (8)$$

for all values of the literals. More generally, we are interested in not the unqualified equivalence of boolean expressions, but rather in their equivalence under known invariants. Hence if two boolean expressions B and C satisfy $$B \wedge I \equiv C \wedge I \qquad (9)$$

for all values of their literals, where I is some invariant known to be true of the system, then we should pick between B and C the one that we should prefer to implement; this choice would commonly be guided by which of B or C has better performance or lower cost. The weakest invariant is true, which was yet enough for the trivial example of removing c.1. More commonly, we shall use the invariant of Equation 3; this way, we should for instance see that we could simplify $c.0 \wedge c.1$ as false.

In fact, several transformations that we do can be treated as boolean simplifications under various "invariants." Taking advantage of this, we introduce three separate boolean expressions, as follows:

The invariant, I: this is the invariant of Equation 3 strengthened with any invariants that the user should care to specify in the PL1 source code. For merge, I is $\neg(c.0 \wedge c.1) \wedge \neg(la.0 \wedge la.1) \wedge \neg(lb.0 \wedge lb.1)$.

The slack-elastic invariant, S: this is what can always be true in a slack-elastic system, namely the statement that some value has arrived on each of the input channels. For merge, S is $(c.0 \vee c.1) \wedge (la.0 \vee la.1) \wedge (lb.0 \vee lb.1)$. (This is not really an invariant at all, but we call it that anyhow because we use it in the same way as the real invariant.)

The eventual invariant, E: this is what eventually must be true of the inputs to a process if the system is not to deadlock; in other words, E is exactly the progress condition under which a process shall finish its current execution cycle. For merge, E is $(c.0 \wedge (la.0 \vee la.1)) \vee (c.1 \wedge (lb.0 \vee lb.1))$. (This is a bit more like the usual notion of an invariant than S.)

Based on these invariants, we use a simple, greedy algorithm for simplification of the sum-of-products expressions (step 92 of FIG. 6). The Modula-3 code for it is given below.

```
PROCEDURE
InvSimplify(self : T; inv, weakeningInv, eventualInv : Bool.T) : T =
    VAR
        res := Copy(Simplify(self)); (* pre-process *)
        fullInv := Bool.And(inv,weakeningInv);
    BEGIN
        SortSopDisjunct.Sort(res.rep^);
        (* first remove all disjuncts that are false under the inv *)
        FOR i := LAST(res.rep^) TO FIRST(res.rep^) BY -1 DO
            IF Bool.And(FromDisjunct(res.rep[i]).toBool( ), inv)
                = Bool.False( ) THEN
                    res.rep := DeleteDisjunct(res.rep,i)
            END
        END;
        VAR simplify := FALSE; BEGIN
            FOR i := LAST(res.rep^) TO FIRST(res.rep^) BY -1 DO
                (* for each disjunct, try removing literals, one by one *)
                WITH c = res.rep[i] DO VAR oldc : Disjunct; BEGIN
                    FOR j := LAST(c^) TO FIRST(c^) BY -1 DO
                        oldc := c;
                        c := DeleteLiteral(c,j);
                        IF Bool.And(res.toBool( ),fullInv) =
                            Bool.And(self.toBool( ),fullInv) THEN
                                simplify := TRUE;
                            ELSE c := oldc END
                    END
                END END
            END;
            IF simplify THEN
                RETURN res.invSimplify(inv,weakeningInv,eventualInv)
            END
        END;
        VAR oldRep := res.rep; BEGIN
            (* try removing disjuncts *)
            FOR i := 0 TO LAST(res.rep^) DO
                res.rep := DeleteDisjunct(res.rep,i);
                IF Bool.And(res.toBool( ),eventualInv) =
                    Bool.And(self.toBool( ),eventualInv) THEN
                        RETURN res.invSimplify(inv,weakeningInv,eventualInv)
                    ELSE res.rep := oldRep END
            END
        END;
        RETURN res
    END InvSimplify;
```

Figure 4:
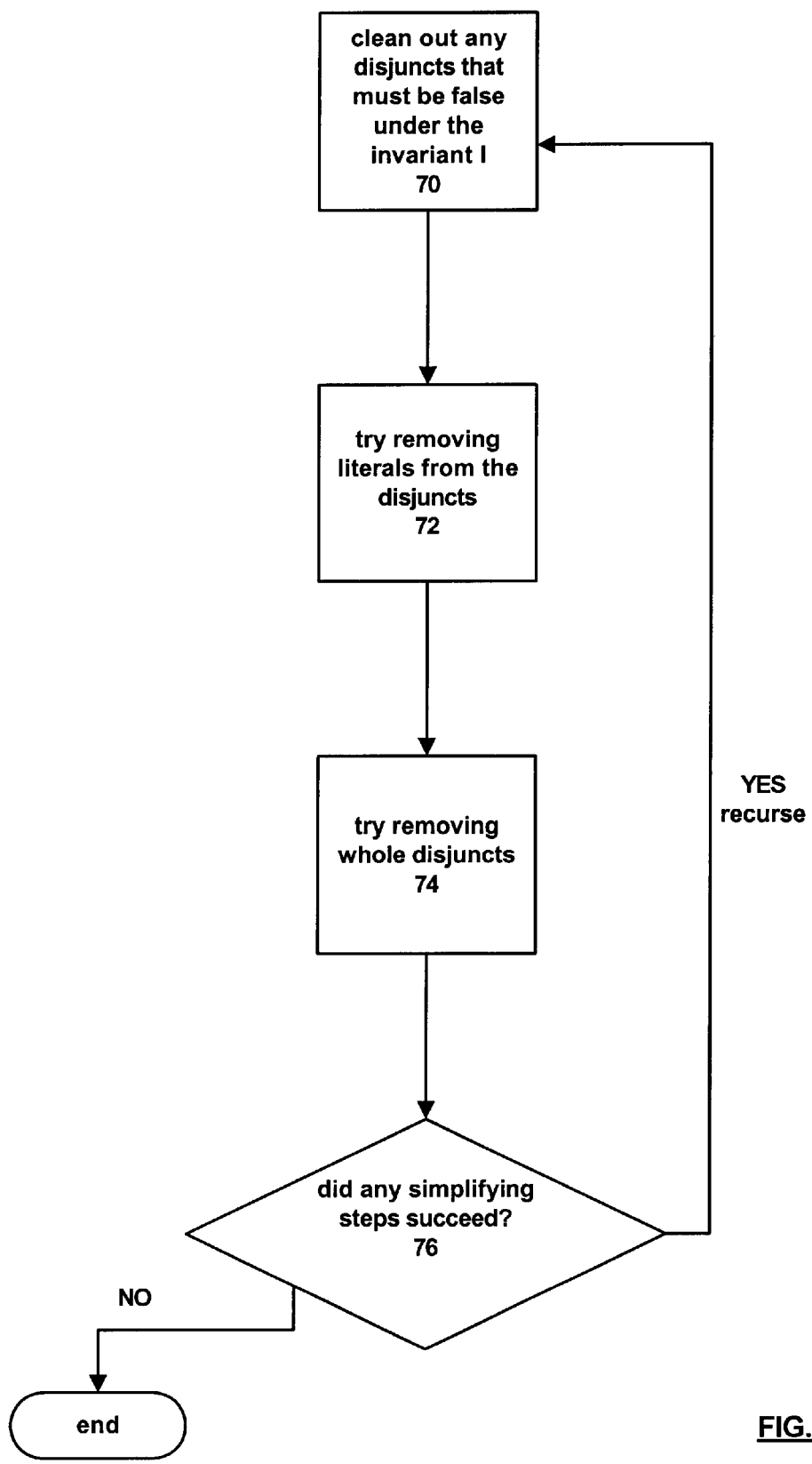
FIG. 4 depicts an algorithm that performs simplification of the input program as part of the back-end compilation step.

FIG. 4 shows the main steps of the algorithm:

Step 70, clean out any disjuncts that must be false under I.

Step 72, try removing literals from the disjuncts, starting with the longest disjunct first—the disjuncts are sorted so that this should be easy. The simplifying invariant that is appropriate for this operation is $I \wedge S$. The reason we can remove literals under S is that removing literals is a logical weakening operation, which hence increases the slack of the process; any behaviors that we thus introduce are allowable under the assumptions of slack-elasticity (this is the weakening that we spoke of in Section 2.2.1).

Step 74, try removing whole disjuncts, again starting with the longest disjunct first. We cannot use S now because while S may always be true, there is no guarantee that it will: we cannot, in the hope that we may simplify the transistor networks, force a process to wait for an input on a channel that is not going to be used on the present cycle: that input may never arrive, whence the system may deadlock. On the other hand, all that we need to do is to avoid deadlock; since E specifies the conditions that must anyway obtain for avoiding deadlock, we can use $I \wedge E$ for the simplifying invariant here.

Step 76, if any one of the simplifying steps should succeed, then recurse.

Referring to the Modula-3 code, we should make it clear that Bool represents the BDD library: even though we are here simplifying sum-of-products expressions, we convert the expressions back into BDDs so that we may conveniently check the logical equivalences that we must check. Bool.And, etc., are the BDD library routines for performing logical operations on BDDs.

The InvSimplify routine is normally called as a method on a sum-of-products-expression object; this expression is referred to as self in the code. Normally, the routine would be called with I in inv, S in weakeningInv, and E in eventualInv. The sum-of-products expression itself is declared as shown in the program listing below; i.e., the data structure is an array of arrays of literals, each of which may be negated.

```
TYPE
    Disjunct = REF ARRAY OF SopLiteral.T;
    Rep = REF ARRAY OF Disjunct;
    Public = OBJECT METHODS
        init( from : Bool.T ) : T; (* initialize from a Bool.T literal *)
        toBool( ) : Bool.T;
        invariantSimplify( invariant,
                            disjunctiveInvariant,
                            eventualInvariant : Bool.T) : T;
    END;
    T = Public BRANDED "Sop Expression" OBJECT
        rep : Rep;
        bool : Bool.T;
    OVERRIDES
        init := Init;
        format := Format;
        toBool := ToBool;
        invariantSimplify := InvariantSimplify;
        map := Map;
    END;
```

2.2.3 Code Generation

At this point, the compiler has generated the logic production-rules. The compilation job is now mostly done. What is left is the code-generation phase (step 96 of FIG. 6).

In the case of STAPL we have an extra step of checking that needs to be performed. For the most part, code generation for STAPL circuits is straightforward; it consists chiefly of adding control signals in the manner described in detail in the referenced co-pending U.S. Patent application "Method and Apparatus for an Asynchronous Pulse Logic Circuit" (filed Oct. 11, 2002, Ser. No. 10/693,543) and then formatting and printing the resulting logical equations. There is little flexibility and few real traps that circuit designers could fall into.

Mainly, we need to be concerned with whether we need the "pattern" logic block, owing to the presence of conditional communications; whether we need to use a pulse generator that can be re-armed in several ways, owing to the process's having conditional sends; whether we need to add foot transistors, owing to the presence of multiple outputs; and whether we need to add extra completion circuitry, owing to the presence of inputs that go unchecked by the logic computations.

One particular trap necessitates the extra step 94 in FIG. 6. This is to tackle the only real difficulty that remains—the detection of inputs that go unchecked by the logic computations. As should be clear from what we have said above of boolean-logic manipulations, an input's being acknowledged by an output can be affected by these manipulations. Whereas we could design the compiler to take these manipulations into account (in the best of worlds, the compiler should treat the boolean-logic manipulations and the completion-circuitry generation as a single problem); this has not yet been done, and may even be an unreasonable thing to ask for. The current compiler uses a simple (and safe) heuristic for determining whether an input will always be acknowledged by the generated outputs. The heuristic works well for all cases that have so far been tested, and it allows a more modular compiler-design than would be possible with a more complicated and accurate method.

The heuristic we use for checking whether a value on an input channel L is acknowledged by the outputs has two parts, both of which err on the safe side:

First, check if the logic of the computed outputs is such that the outputs must acknowledge the input in question. This is the case if, regardless of the disposition of the other inputs, it is always the case that the value on L will affect the computed output—i.e., if regardless of the other inputs, the value arriving on L can always force a choice between at least two alternative outputs on some output channel. If this is so, then no amount of boolean manipulation can remove the outputs' checking of the L-value.

Secondly, check the generated logic for each output channel: does it require the presence of one literal of L before it will produce an output? The conditions that we can thus determine that L will be acknowledged under are the union of the communication conditions for the output channels that contain a literal of L in every disjunct of their output logic.

If either one of the two checks should always succeed, then L is known to be acknowledged by the outputs, and no further checking is necessary. Strictly speaking, we should prefer using only the first condition (since this is the modular one—the second condition is implementation-dependent), but unfortunately, it has been found that processes requiring the second condition's being checked before they would compile without unnecessary input-completion circuitry are fairly common.

2.2.4 Embodiment of Computer Execution Environment (Hardware)

Figure 7:
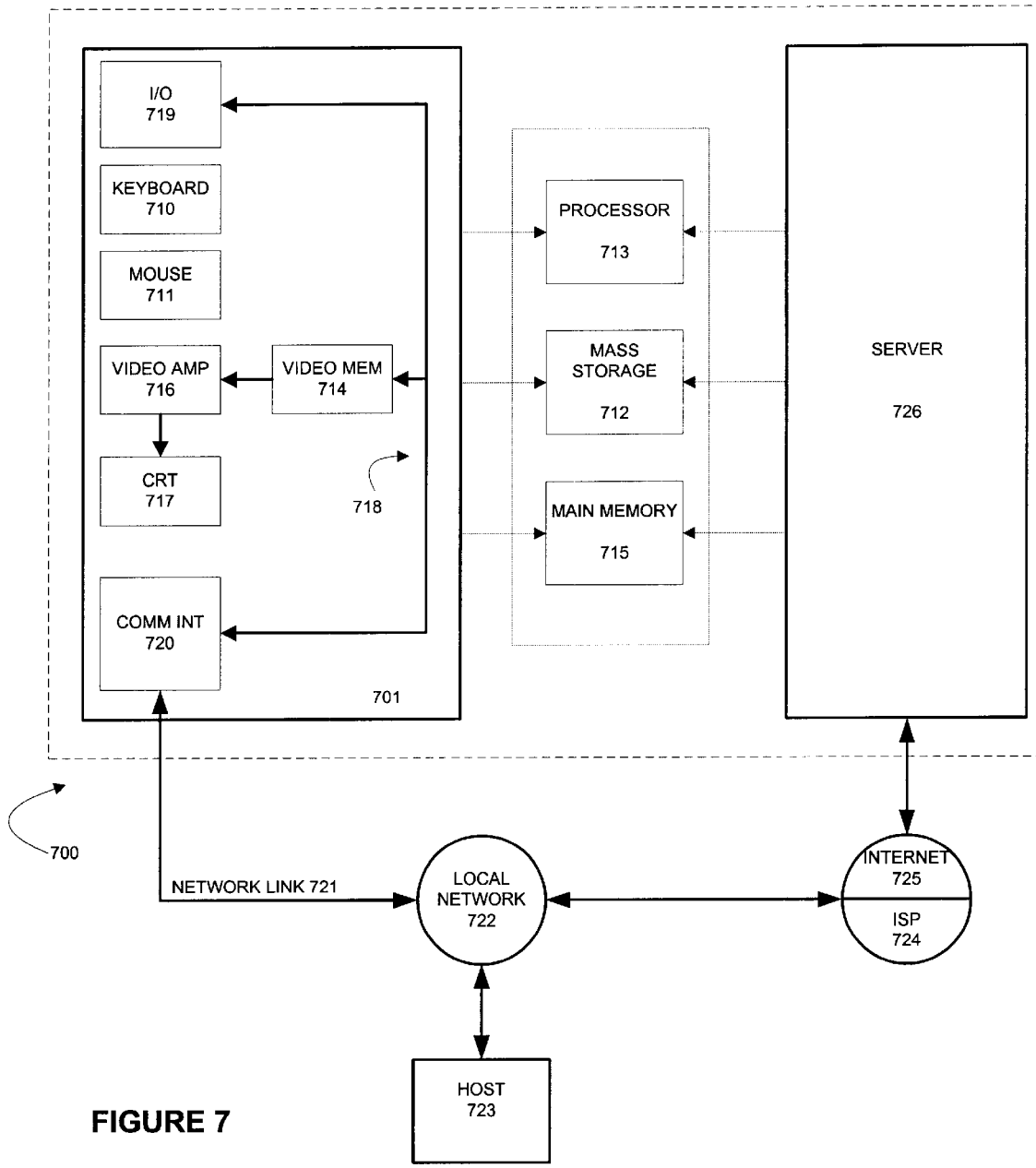
FIG. 7 depicts a general computer embodiment environment in which the compiler program embodiment can be executed.

The compiler embodiment of the invention can be implemented as computer software in the form of computer readable program code executed in a general purpose computing environment such as environment 700 illustrated in FIG. 7. A keyboard 710 and mouse 711 are coupled to a system bus 718. The keyboard and mouse are for introducing user input to the computer system and communicating that user input to central processing unit (CPU) 713. Other suitable input devices may be used in addition to, or in place of, the mouse 711 and keyboard 710. I/O (input/output) unit 719 coupled to bi-directional system bus 718 represents such I/O elements as a printer, A/V (audio/video) I/O, etc. Computer 701 may include a communication interface 720 coupled to bus 718. Communication interface 720 provides a two-way data communication coupling via a network link 721 to a local network 722. For example, if communication interface 720 is an integrated services digital network (ISDN) card or a modem, communication interface 720 provides a data communication connection to the corresponding type of telephone line, which comprises part of network link 721. If communication interface 720 is a local area network (LAN) card, communication interface 720 provides a data communication connection via network link 721 to a compatible LAN. Wireless links are also possible. In any such implementation, communication interface 720 sends and receives electrical, electromagnetic or optical signals which carry digital data streams representing various types of information.

Network link 721 typically provides data communication through one or more networks to other data devices. For example, network link 721 may provide a connection through local network 722 to local server computer 723 or to data equipment operated by ISP 724. ISP 724 in turn provides data communication services through the world wide packet data communication network now commonly referred to as the "Internet" 725. Local network 722 and Internet 725 both use electrical, electromagnetic or optical signals which carry digital data streams. The signals through the various networks and the signals on network link 721 and through communication interface 720, which carry the digital data to and from computer 700, are exemplary forms of carrier waves transporting the information.

Processor 713 may reside wholly on client computer 701 or wholly on server 726 or processor 713 may have its computational power distributed between computer 701 and server 726. Server 726 symbolically is represented in FIG. 7 as one unit, but server 726 can also be distributed between multiple "tiers". In one embodiment, server 726 comprises a middle and back tier where application logic executes in the middle tier and persistent data is obtained in the back tier. In the case where processor 713 resides wholly on server 726, the results of the computations performed by processor 713 are transmitted to computer 701 via Internet 725, Internet Service Provider (ISP) 724, local network 722 and communication interface 720. In this way, computer 701 is able to display the results of the computation to a user in the form of output.

Computer 701 includes a video memory 714, main memory 715 and mass storage 712, all coupled to bi-directional system bus 718 along with keyboard 710, mouse 711 and processor 713. As with processor 713, in various computing environments, main memory 715 and mass storage 712, can reside wholly on server 726 or computer 701, or they may be distributed between the two. Examples of systems where processor 713, main memory 715, and mass storage 712 are distributed between computer 701 and server 726. The mass storage 712 may include both fixed and removable media, such as magnetic, optical or magnetic optical storage systems or any other available mass storage technology. Bus 718 may contain, for example, thirty-two address lines for addressing video memory 714 or main memory 715. The system bus 718 also includes, for example, a 32-bit data bus for transferring data between and among the components, such as processor 713, main memory 715, video memory 714 and mass storage 712. Alternatively, multiplex data/address lines may be used instead of separate data and address lines.

Main memory 715 is comprised of dynamic random access memory (DRAM). Video memory 714 is a dual-ported video random access memory. One port of the video memory 714 is coupled to video amplifier 716. The video amplifier 716 is used to drive the cathode ray tube (CRT) raster monitor 717. Video amplifier 716 is well known in the art and may be implemented by any suitable apparatus. This circuitry converts pixel data stored in video memory 714 to a raster signal suitable for use by monitor 717. Monitor 717 is a type of monitor suitable for displaying graphic images.

Computer 701 can send messages and receive data, including program code, through the network(s), network link 721, and communication interface 720. In the Internet example, remote server computer 726 might transmit a requested code for an application program through Internet 725, ISP 724, local network 722 and communication interface 720. The received code may be executed by processor 713 as it is received, and/or stored in mass storage 712, or other non-volatile storage for later execution. In this manner, computer 700 may obtain application code in the form of a carrier wave. Alternatively, remote server computer 726 may execute applications using processor 713, and utilize mass storage 712, and/or video memory 715. The results of the execution at server 726 are then transmitted through Internet 725, ISP 724, local network 722 and communication interface 720. In this example, computer 701 performs only input and output functions.

Application code may be embodied in any form of computer program product. A computer program product comprises a medium configured to store or transport computer readable code, or in which computer readable code may be embedded. Some examples of computer program products are CD-ROM disks, ROM cards, floppy disks, magnetic tapes, computer hard drives, servers on a network, and carrier waves.

PL1 Specification

This section describes Pipeline Language 1 (PL1). The syntax and semantics of the lanuage will be presented in details along with an example to illustrate usage.

3.1 Scope

We shall make frequent reference to processes in this section. Traditionally, processes are thought of as the sequential building blocks of a parallel system. Restricting internal concurrency is too narrow a view, and we take the position that processes are simply parts of a parallel system that communicate with each other on channels. Arbitrary shared variables are hence not allowed between processes. The reader that is satisfied with using shared variables is urged to ignore the metaphysical implications of something's being a process; he can simply take the process as a syntactic construct that we introduce for structuring a concurrent system.

Programs written in PL1 describe processes, not entire systems. The hierarchy required for describing an entire system is expounded in some other language, such as the CAST language or a general-purpose language like C or Modula-3.

3.2 Structure of PL1

The PL1 language is defined by proceeding through several levels. At the lowest level are the syntactic tokens, such as keywords and identifiers. These tokens are combined to make expressions and actions. Finally, the expressions and actions are arranged to make a process description.

We discuss the syntax of the language first and the semantics later.

3.3 Syntax Elements

We describe the PL1 syntax bottom-up: We start with the lexical definition of tokens and proceed later to the grammatical definition of language components.

The lexical components of a PL1 program are comments, keywords, integers, identifiers, expression operators, and special operators. Out of these components are built expressions and actions.

We shall use regular expressions for describing the lexical elements of PL1.

3.3.1 Keywords

The following are keywords with special meaning in PL1: true, false, void, define, communicate, goto, go to, invariant. Keywords may not be used as identifiers.

3.3.2 Comments

A comment is, as in the C language, started by /*. The comment includes all the text to the next occurrence of */. Comments do not nest. The text in a comment is without meaning in the language.

3.3.3 Numericals

Numerical data is limited to integers and can be expressed either in hexadecimal (base 16) or in decimal. Hexadecimals begin with the special sequence 0x.

<numerical>:=[0-9][0-9]*|0x[0-9a-f][0-9a-f]*

3.3.3.1 Boolean numbers

For convenience, the keyword true is understood, in all contexts, as the integer 1, and the keyword false is likewise understood as the integer 0.

<integer>:=<numerical>|true|false 3.3.4 Identifiers

As identifiers, anything is legal that is not a keyword, a numerical, a type identifier (see Section 3.4.1), or the sequence 0x, and further is described by <identifier>:=[$a-zA-Z$_{13}$ 0-9][$a-zA-Z__0-9]*.

3.3.5 Reserved Special Operators

PL1 reserves a few tokens as special operators—they can appear outside expressions, with different meaning than when they appear within expressions. The special operators are →, =, !, and ?. Of these, ? and → can never appear in an expression.

3.3.6 Expression Operators

The PL1 expression operators are inspired by C. Operators are either unary or binary. Note that—can be either the unary negation operator or the binary subtraction operator; the distinction is made in the grammar. A similar duality applies to +.

< unary operator >:= −|+|!|~
< binary operator >:= *|/|%|<<|>>|+|−|<|<=|=<|>|>=|=>|==|!=|&|^|||&&|||||#>

3.3.7 Expression Syntax

Expressions are written as infix or prefix strings of operations on integers and identifiers, as in normal mathematical notation or as in C. Note that parentheses are allowed in expressions. The parentheses that denote optional elements in the grammar are set in a larger and lighter font.

```
< action >:= < send action >|< receive action >|< state action >
< action subject >:=< identifier >
< action object >:=< expression >
< send action >:= < action subject >!< action object >
< receive action >:= < action subject >?
< state action >:= <action subject >=< action object >
```

3.3.8 Actions

PL1 programs execute actions. Three types of actions are defined: send actions, receive actions, and state actions.

```
< expression >:= < identifier >|< integer >|< unary operator >< expression >|
    < expression >< binary operator >< expression >|(< expression >)
```

3.3.8.1 Implicit Declaration by Actions

Making an identifier the subject of a send action implicitly declares the identifier as an output channel. Conversely, making an identifier the subject of a receive action implicitly declares the identifier as an input channel.

3.4 PL1 Process Description

The actions and expressions are arranged to make a PL1 process description. For completeness, we also define declarations and invariants.

3.4.1 Declarations

All PL1 variables must be mentioned in declarations before being used. Declarations can be of two kinds: argument declarations and local declarations. Argument declarations declare the input-output channels of a process; thus, argument declarations define variables that have a type denoted by channel type-identifiers. Conversely, local declarations define variables whose types are denoted by local type-identifiers. Currently we define a restricted set of data types, viz.,

```
         < channel type identifier >:= e1of[1-9] [0-9]*
    and
         < local type identifier >:= 1of[1-9] [0-9]*.
```

We currently also enforce the further restriction that all variables are of type 1ofx or e1ofx where $x=2^n$ for some non-negative integer $n<N$, where N is implementation-dependent. The restriction that x must be a power of two may be removed in a future implementation, but the restriction that x must be bounded is likely to remain.

Thus:

```
< argument decl >:=
    < channel type identifier > < identifier >(,< identifier >)...
< local decl >:=
    < local type identifier > < identifier >(,< identifier >)...
```

No syntax is provided for making the explicit distinction between input and output channels. However, the implementation will enforce the distinction by checking that either only receive or only send actions are performed on a given channel.

The distinction between argument types and local types is intrinsic to the language, but the specific data types provided are subject to change.

3.4.2 Communication Statement

The communication statement joins a communication condition, in the form of an expression, with the relevant actions.

```
< guard >:=< expression >
< communication statement >:= < guard > -> < action >(, < action >)...
```

3.4.3 Process Communication-block

A PL1 process consists of the following parts, in order: a process declaration, a list of local declarations, a list of invariant statements, and a communication block. Each component is optional except the process declaration itself.

```
< communication block >:= communicate {
    < communication statement >(;< communication statement >)...
}
< invariant >:= invariant { < expression > }
< process >:=
    define < identifier > ((< argument decl >(;< argument decl >)...)){
        (< local decl >(;< local decl >)...)
        (< invariant >(< invariant >)...)
        (< communication block >)
    }
```

The process is the highest-level syntactic element in PL1. The interactions between processes are handled externally to the language.

3.5 Semantics

The semantics of PL1 may be broadly divided into three categories: expression semantics, action semantics, and concurrency semantics.

3.5.1 Expression Semantics

All PL1 expressions are evaluated as two's-complement binary quantities. We have already covered the syntactic appropriateness of the various PL1 language operators. The operations defined in the grammar have the following meanings defined in the following tables.

3.5.1.1 Binary Operators

The binary operators in PL1 have operator precedence as in C. In the following table, the precedence is indicated by grouping, with the precedence falling as we descend down the table. All binary operators are left-associative. (In contrast to C, the right-associative assignment is not an operator as such in PL1; it is instead part of an action statement.)

| Operator | Interpretation | Operand(s) | Result |
|---|---|---|---|
| * | Multiplication | integer | integer |
| / | Division | integer | integer |
| % | Remainder | integer | integer |
| + | Addition | integer | integer |
| - | Subtraction | integer | integer |
| << | Left shift | integer | integer |
| >> | Right shift | integer | integer |
| < | Less than | integer | boolean |
| <=,=< | Less than or equal | integer | boolean |
| > | Greater than | integer | boolean |
| >=,=> | Greater than or equal | integer | boolean |
| == | Equal | integer | boolean |
| != | Not equal | integer | boolean |
| & | Bitwise AND | integer | integer |
| ^ | Bitwise XOR | integer | integer |
| \| | Bitwise OR | integer | integer |
| && | Logical AND | boolean | boolean |
| \|\| | Logical OR | boolean | boolean |
| #> | Logical IMPLIES | boolean | boolean |

3.5.1.2 Unary Operators

The unary operators have higher precedence than any binary operators and are listed in the following table.

| Operator | Interpretation | Operand(s) | Result |
|---|---|---|---|
| ! | Logical NOT | boolean | boolean |
| ~ | Bitwise NOT | integer | integer |
| − | Negation | integer | integer |
| + | | integer | integer |

Because of the syntax of actions, expression operators have higher precedence than delimiters used in actions.

3.5.1.3 Boolean Type-coercion

As in C, coercion between boolean values and integer values is done as follows:

1. A boolean result used as an operand to an integer operator is interpreted as 1 if it evaluates to true and as 0 if it evaluates to false.
2. An integer result used as an operand to a boolean operator is interpreted as false if it evaluates to 0 and as true in all other cases.

These are the same rules as are used for converting the constants true and false to integers.

3.5.1.4 Integer Type-coercion

If the size (in bits) of the result of an evaluation does not match the size of the variable that it is assigned to or the size of the channel that it is sent on, the result is either sign-extended (if it is too narrow) or bitwise truncated (if it is too wide). The use of negative quantities is, in general, discouraged since all built-in datatypes are unsigned.

3.5.1.5 Use of Channel Identifiers

An identifier used in an expression that refers to a channel or to a state variable evaluates to the current value of the channel or state variable in question. If there is no current value (because none has been sent on that channel), then the expression does not evaluate. There is no way of accessing a value corresponding to the "undefined" or "no-data" state of a channel. The channel value cannot change during the current round of execution because it can only be updated after it has been removed by the receiving process.

3.5.2 Action Semantics

Three types of variables with associated actions are defined in PL1. Send actions are defined for output channels, receive actions are defined for input channels, and assignment actions are defined for state variables. Channels between processes are first-in-first-out.

3.5.2.1 Receive Actions

When a receive action is enabled for an input channel, the value present on the input channel will be disposed of, after it has been used in any expressions that it appears in. On the next round of execution of the process, the next value will be provided, if necessary.

5 3.5.2.2 Send Actions

When a send action is enabled for an output channel, a value equal to the current value of the expression that is the object of the send action will be sent on the channel.

3.5.2.3 Assignment Actions

When an assignment action is enabled for a state variable with an object expression that evaluates to w, the value present in the state variable on the current round will be disposed of. On the next round of execution of the process, the next value $v_{i+1}=w$ will be provided, if necessary.

3.5.3 Execution Semantics

The semantics of a PL1 process may be defined in terms of an execution. The execution of the process may either fail, in which case no actions are performed, or it may succeed, in which case all enabled actions are performed concurrently. If the execution fails, it will be retried at a later time.

The execution of a PL1 process can be thought of as the infinite loop:

Wait until it can be determined, for each guard, whether it evaluates to true or false;

Wait until all values required for computing action objects are available;

Concurrently execute all enabled actions.

The execution of a PL1 process may succeed only if enough operands are available such that it is possible to evaluate all communication-statement guards either to true or to false (using the type-coercion rules, if necessary) and if all values required for computing the objects of the send and assignment actions are available. If these conditions do not obtain, the execution will fail. The evaluation of the guards and the variables required for computing the objects of the actions may be performed concurrently; likewise, the actions may be performed concurrently. However, the evaluation of the guards and the variables required for computing the objects of the actions strictly precedes the actions themselves—this ensures that the guards and action objects are stable.

3.5.4 Invariants

Invariants are provided as a convenience. The programmer indicates that some predicate will hold as a precondition of the execution of a program, given that the involved values may be computed. The invariant may be used to simplify the implementation, and the implementation may optionally check that the invariant is always satisfied and else abort the computation in an implementation-dependent way.

3.5.5 Semantics in Terms of CHP

The execution semantics of a PL1 program may be described in terms of the extended CHP language, which includes the value probe and peek.

3.5.5.1 The Channel Peek

The peek $¿$ works like a receive, except that it leaves the channel in the state it was in before the peek was executed.

$$\{\overline{X}\}X¿x\{\overline{X}\}$$

3.5.5.2 Channel Values

We use the idea of the value on a channel for defining the value probe. The same idea is also used for defining the semantics of expressions in PL1. The value on a channel X, val(X) may be defined in terms of Hoare triples as follows:

$$\{val(X)=v\wedge\overline{X}\}X?x\{x=v\}$$
$$\{val(X)=v\wedge\overline{X}\}X¿x\{x=v\}$$

(But of course X?x and X$¿$x have different effects on the next value that shall be seen on the channel.)

3.5.5.3 The Value Probe

Slack elasticity allows the value probe $$\overline{<,i::X_i>}:P(<,i::X_i>)$$

to be defined for one channel as $$\overline{X:P(X)}\equiv\overline{X}\wedge P(X)|_{x\to val(X)}$$

and extended to predicates involving multiple channels as $$\overline{X,Y:S(X)\wedge S(Y)}\equiv\overline{X:S(X)}\wedge\overline{Y:S(Y)} \quad (*)$$

$$\overline{X,Y:S(X)\vee S(Y)}\equiv\overline{X:S(X)}\vee\overline{Y:S(Y)} \quad (\dagger)$$

An alternative definition is possible by defining the value probe directly for multiple channels and replacing the equivalence with $\equiv_\infty$ in (*) and (†), where $\equiv_\infty$ denotes equivalence under infinite slack.

Alternatively, a direct definition of the value probe is possible:

$$\{\overline{X:P(X)}\}X?v\{P(v)\}$$
$$\{\overline{X}\wedge\neg\overline{X:P(X)}\}X?v\{\neg P(v)\}$$
$$\{\neg\overline{X:P(X)}\}X?v\{\neg P(v)\}$$

However, in PL1 the concept of val(X) is ubiquitous, since it is used directly in expression evaluation.

3.5.5.4 Semantics in Terms of Value Probe

To define the semantics of the PL1 process, we must specify what is meant by "waiting until it can be determined, for each guard, whether it evaluates to true or false." We therefore introduce the tilde operator as follows:

$$\sim\overline{X:P(X)}\equiv\overline{X:\neg P(X)}$$

For instance, $$\sim\overline{X,Y:S(X)\vee S(Y)}=\overline{X:\neg S(X)}\wedge\overline{Y:\neg S(Y)}.$$

At this point, we can define the semantics of the PL1 program. The program $$\text{communicate}\{G_0 \to C_0; \ldots; G_n \to C_n\}$$

where the $C_i$'s do not use variables and no action is enabled more than once on a single iteration of the program is defined as $$*[\ [<\wedge i : n : G_i \vee \sim G_i >];$$
$$<\|\ i : n : [G_i \to C_i\ \square\ \sim G_i \to skip] >$$
$$].$$

If the $C_i$'s use variables, these must be renamed so that there is no conflict in executing the $C_i$'s concurrently. We introduce the notation vars(X) for the set of variables that the action X depends on. The program definition is then $$*[\ [<\wedge i : n : G_i \vee \sim G_i >];$$
$$<\|\ i : n : [G_i \to <v : v \in \text{vars}(C_i) : L_v \dot{c} \lambda_v >\ \square\ \sim G_i \to skip] >;$$
$$<\|\ i: n: [G_i \to C_i|_{v:v\in\text{vars}(C_i):v\to\lambda_v}\ \square\ \sim G_i \to skip] >$$
$$],$$

where $L_v$ denotes the input channel associated with the name v and $\lambda_v$ is a temporary local variable; the notation $v \to \lambda_v$ means that we replace each variable v with the temporary $\lambda_v$.

If any actions are enabled more than once on a single iteration, the actions must have the same action objects (i.e., the same values for sends); multiply enabled actions behave like the single execution of one of the actions.

3.5.6 Slack Elasticity

Slack elasticity allows leeway in terms of the exact ordering of actions by PL1 programs. If a system is slack elastic, then it does not matter when values are sent on channels, as long as they are sent in the right order. The informal definition of the execution semantics of PL1, as well as the definition in terms of CHP, provides the least amount of slack possible. Given that the system being designed is slack-elastic, the only way in which the specification could be violated by the implementation is through the introduction of deadlock. Since the PL1 semantics as defined here has the least slack of all possible implementations, any slack-elastic system that behaves correctly and avoids deadlock with the PL1 semantics will behave correctly and avoid deadlock using any legal implementation.

In practice, an implementation of a PL1 process in a slack-elastic system is allowed to produce output values as soon as they can be determined, which can be before all the guards have been checked. This property can be used to great effect, e.g., in production-rule implementations.

3.6 Examples

A process that repeatedly sends the value 1 on its output channel would be written as follows:

```
define bitgen(e1of2 r)
{
    communicate {
        true -> r!1;
    }
}
```

A full-adder would be written as follows:

```
define fulladder(e1of2 a,b,c; e1of2 s,d)
{
    communicate {
        true -> s!(a+b+c)&0x1,d!(!!((a+b+c)&0x2)),a?,b?,c?;
    }
}
```

In the mysterious expression d!(!!((a+b+c)&0×2)), the first exclamation mark denotes the send communication, whereas the next two are C-style inversions. (The value of the expression x is zero if x is zero and one otherwise.)

A two-input merge would be written as follows:

```
define merge(e1of2 l0,l1,s; e1of2 r)
{
    communicate {
        true -> s?;
        s == 0 -> r!l0, l0?;
        s == 1 -> r!l1, l1?;
    }
}
```

A contrived example PL1 program that does nothing very interesting (except illustrate some of the syntax of the language) is shown here:

```
define contrivedExample(e1of2 l0, l1, c; e1of2 r, z)
{
    invariant { l0 + l1 + 2*c > 1 }
    communicate {
        !(c == 1) -> r!l0, l0?, z!(c + l0);
        c == 1 && l1 == 0 -> r!l1, z!1;
        c == 1 && l1 == 1 -> r!0;
        c == 1 -> l1?;
        true -> c?;
    }
}
```

Illustrating the use of state variables, we may write an alternator as follows:

```
define alternator(e1of2 r)
{
    1of2 s;
    communicate {
        true -> s=!s,r!s;
    }
}
```

Conclusion

Thus, a method of programming circuit designs and a system for compiling such circuit designs are described in conjunction with one or more specific embodiments. The invention is defined by the claims and their full scope of equivalents.

What is claimed is:

1. A method for generating circuit designs, comprising:

writing a program in a message-passing based programming language;

choosing a portion of said program to compile directly into circuits;

conforming said chosen portion of said program to another programming language specification, wherein said specification enforces rules that prevent channels in said program from becoming shared variables in circuits; and sending said chosen portion of said program to a circuit compiler for said programming language specification.

2. The method of claim 1 wherein said programming language specification is Pipeline Language 1.

3. The method of claim 1 wherein said message-passing based programming language is CHP.

4. The method of claim 1 wherein said programming language specification reads and writes channels as if they were shared variables and yet ensures that all channel actions are properly sequenced.

5. A method of compiling circuit design, comprising: utilizing a front-end compiler module to evaluate an input program written a message-passing based programing language and generate an unary encoding of said input program;

passing said unary encoding to a back-end compiler module;

utilizing said back-end compiler module to produce PRS for said input program using a sum-of-products representation.

6. The method of claim 5 wherein said step of utilizing a front-end compiler module further comprises:

obtaining an input program;

parsing said input program into BDD expressions;

checking the determinism conditions of said input program;

generating BDD expressions for assignment and send statements in said input program;

looping through all possible values in said BDD expressions; and converting said BDD expressions to unary representation.

7. The method of claim 5 wherein said step of utilizing said back-end compiler module further comprises:

converting said unary representation of said input program into a sum-of-products representation;

performing logic simplification in said sum-of-products representation of said input program and generating a resulting simplified logic representation of said input program; and generating actual circuit design implementation for said input program.

8. The method of claim 7 wherein said step of performing logic simplification further comprises:

using an invariant I and any invariants that can be specified by the programmer;

using a slack-elastic invariant S; and using an eventual invariant E.

9. The method of claim 8 wherein said step of performing logic simplification further comprises:

cleaning out any disjuncts that must be false under the invariant I;

attempting to remove literals from the disjuncts, whereby all disjuncts are evaluated, starting with the longest disjunct, under the invariant I∧S to determine whether literals can be removed;

attempting remove whole disjuncts, whereby all disjuncts are evaluated, starting with the longest disjunct, under the invariant I∧S to determine whether whole disjuncts can be removed; and verifying whether said step of attempting to remove literals or said step of attempting to remove whole disjuncts succeeded and recursively repeat said steps of attempting to remove literals from the disjuncts and attempting remove whole disjuncts if prior attempts were verified to be successful.

10. The method of claim 7 wherein said step of generating actual circuit design implementation further comprises:

checking said generated logic of said input program is such that outputs must acknowledge an input channel;

checking said generated logic of said input program for each output channel to determine whether said output channel require the presence of one literal of said input channel; and determining if one of said two checking steps succeed.

11. A circuit program compiler, comprising:

a computer usable medium having computer readable program code embodied therein configured to compile a circuit program, said computer program product comprising:

a front-end compiler module wherein an input program written in a message-passing based programing language an unary encoding of said input program is generated; and a back-end compiler module wherein said unary encoding of said input program is received and converted to a sum-of-products representation to produce a PRS for said input program.

12. The circuit program compiler of claim 11 wherein said front-end compiler comprises:

computer readable code configured to cause a computer to obtain an input program;

computer readable code configured to cause a computer to parse said input program into BDD expressions;

computer readable code configured to cause a computer to check the determinism conditions of said input program;

computer readable code configured to cause a computer to generate BDD expressions for assignment and send statements in said input program;

computer readable code configured to cause a computer to loop through all possible values in said BDD expressions; and computer readable code configured to cause a computer to convert said BDD expressions to unary representation.

13. The circuit program compiler of claim 11 wherein said back-end compiler comprises:

computer readable code configured to cause a computer to perform logic simplification in said sum-of-products representation of said input program.

14. The circuit program compiler of claim 13 wherein said back-end compiler comprises:

computer readable code configured to cause a computer to check whether an input is always be acknowledged by the generated outputs in said logic simplification.

15. The circuit program compiler of claim 11 wherein said front-end compiler module is technology-independent.

16. The circuit program compiler of claim 11 wherein said front-end compiler module is implemented in Modula-3 code.

17. The circuit program compiler of claim 11 wherein said back-end compiler module is technology-dependent.

18. The circuit program compiler of claim 11 wherein said back-end compiler module generates Modula-3 codes.

19. The circuit program compiler of claim 11 wherein said back-end compiler module generates C codes.

20. The circuit program compiler of claim 11 wherein said back-end compiler module generates QDI circuit designs.

21. The circuit program compiler of claim 11 wherein said back-end compiler module generates STAPL circuit designs.

* * * * *